United States Patent [19]

Windsor et al.

[11] Patent Number: 5,126,910

[45] Date of Patent: Jun. 30, 1992

[54] MODULAR COMPUTER MEMORY CIRCUIT BOARD

[75] Inventors: James A. Windsor, Tomball; Mustafa A. Hamid; Roy E. Thoma, both of Houston; James P. Paschal, Spring; Francis A. Felcman, Rosenberg, all of Tex.

[73] Assignee: Compaq Computer Corporation, Houston, Tex.

[21] Appl. No.: 521,603

[22] Filed: May 10, 1990

Related U.S. Application Data

[62] Division of Ser. No. 354,115, May 19, 1989, abandoned.

[51] Int. Cl.⁵ .......................... H02H 3/20; G11C 5/04
[52] U.S. Cl. .......................................... 361/42; 365/52
[58] Field of Search ....................... 361/42, 52, 82, 84, 361/86, 58, 1, 409, 413; 307/127; 174/52.4, 250; 365/62, 52, 53

[56] References Cited

U.S. PATENT DOCUMENTS

| | | | |
|---|---|---|---|
| 4,109,161 | 8/1978 | Iijima | 307/87 |
| 4,426,689 | 1/1984 | Henle et al. | 365/52 |
| 4,495,546 | 1/1985 | Nakamura et al. | 361/413 |
| 4,514,786 | 4/1985 | Charruau | 361/413 |
| 4,675,769 | 6/1987 | Marshall et al. | 361/1 |
| 4,695,914 | 9/1987 | Ohtsuki et al. | 361/42 |
| 4,727,513 | 2/1988 | Clayton | 365/52 |
| 4,763,298 | 8/1988 | Hoelzel et al. | 365/51 |
| 4,858,056 | 8/1989 | Russell | 361/42 |
| 4,884,237 | 11/1989 | Mueller et al. | 365/52 |
| 4,891,789 | 1/1990 | Quattrini et al. | 361/409 |

FOREIGN PATENT DOCUMENTS

| | | |
|---|---|---|
| 0289157 | 11/1988 | European Pat. Off. . |
| 3005269 | 8/1981 | Fed. Rep. of Germany ........ 365/52 |
| 60-10481 | 1/1985 | Japan . |
| 2130025 | 5/1984 | United Kingdom ................. 365/52 |

OTHER PUBLICATIONS

"High Density Memory Package", IBM Technical Disclosure Bulletin, vol. 27, No. 4B, Sep. 1984, p. 2642.

IBM Corporation Technical Disclosure Bulletin, vol. 20, No. 11B, pp. 4868-4869, Apr. 1978, for "Overload and Current Sensing for Circuit Boards".

Compaq Computer Corp., Compaq Deskpro 386/20 Personal Computer Technical Reference Guide, Cover and Publication Page, pp. 3-14 and 3-20, 3-33 to 3-39 and 3-45 to 3-49; Layout Drawings and Schematics of 4 Mbyte, 32 Bit System Memory Board and 4 Mbyte, 32 Bit Memory Module For Compaq Deskpro 386/20, Oct. 1987.

*Primary Examiner*—Geoffrey S. Evans
*Attorney, Agent, or Firm*—Pravel, Gambrell, Hewitt, Kimball & Krieger

[57] ABSTRACT

A memory expansion board capable of holding up to 16 Mbytes of memory devices, using primarily 1 Mbit chips, in 2 Mbyte module increments, on a single IBM PC/AT compatible size board. The circuit board is so designed that when the memory expansion board is populated by modules and placed in a computer system it does not interfere with any of the other expansion slots within the computer system, all of the expansion slots being normally spaced apart. The memory expansion board also includes a means of protecting the memory expansion board and modules from damage due to misalignment when inserting the board and/or modules. When certain of the modules are inserted rotated 180 degrees the circuit board cannot be properly installed in the system board because of physical interference. Lastly, the memory expansion board includes a means for providing reduced length addressing memory lines to memory devices appearing on opposite sides of a circuit board.

6 Claims, 8 Drawing Sheets

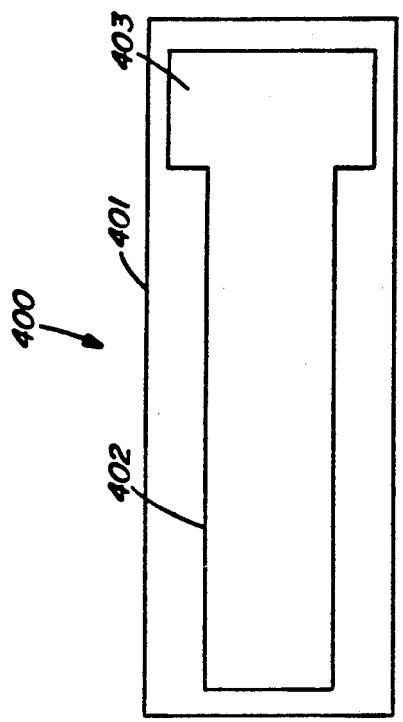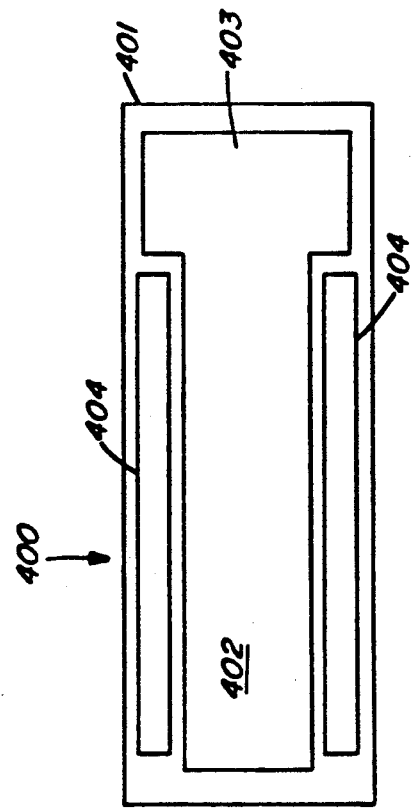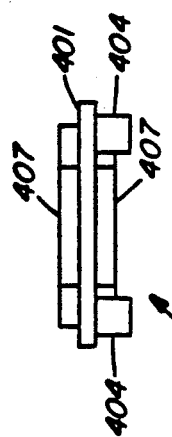

MODULAR COMPUTER MEMORY CIRCUIT BOARD

RELATED APPLICATIONS

This is a divisional application of U.S. application Ser. No. 354,115 field May 19, 1989, now abandoned.

BACKGROUND OF THE INVENTION

1. Field of the Invention

The present invention relates to memory circuit boards installed in computer systems.

2. Description of the Prior Art

Many computer systems utilize what are called mother boards, system boards, or main boards which contain signal busses, microprocessors, device controllers, device interface connectors, and expansion slots. The system boards generally include some amount of base memory on the board itself. The system boards may also include predesignated locations or sockets for the installation of additional semiconductor memory chips, thereby increasing the base memory of the computer system. However, factors such as system board space allocation place a practical limit on the amount of memory which may be added to a system board.

One manner of addressing this practical limitation is to add memory through the use of circuit boards external to the main system board. These external memory boards are connected to the system board by means of connectors or slots on the system board. Generally, a memory expansion board is inserted into one of the system board's expansion slots and the computer system is updated as to the total amount of available memory to include the base memory on the system board and the memory on the expansion board. The means of updating the computer system as to the total memory available may include mechanical means, such a switches or jumpers, or electronic means, such as setting certain signal lines to certain levels.

Another manner of addressing the space limitations of the system board was to use single inline memory modules (SIMM's) on the system board. On a SIMM the memory devices use very small packages and are very densely packed, so that a large amount of memory can be installed in a small area. The SIMM is installed in a connector on the system board and are installed perpendicular to the system board, thus using little space.

Recent developments in computer technology, particularly in the area of microcomputers have lead to an increase in the amount of total memory which may be effectively managed by the computer systems. With the introduction of Intel Corporation's 80386 microprocessor, microcomputers are now capable of managing in excess of 16 megabytes (Mb) of memory. With the advancement of gate array and application specific integrated circuits (ASIC's) many functions previously performed on interchangeable circuit boards located in slots on the system board have been integrated onto the system board. Thus, system board space becomes even more precious and memory areas must be very dense. The space problem on the memory board can become so severe that even the use of SIMM's can not be tolerated and all the memory must be placed on external circuit boards.

Personal computers are generally designed to use circuit boards conforming to a selected standard for expansion. One such standard is the Industry Standard Architecture (ISA) which is based on the IBM PC/AT manufactured by International Business Machines Corporation (IBM). The use of the ISA standard limits the physical size of the circuit boards and memory boards which can be installed in the computer system. This size limitation, when coupled with the addressing capabilities of the microprocessors such as the 80386 and the demands for memory developed by many computer programs currently available, limits the amount of memory which can be installed on an external circuit board. The use of SIMM's may result in sufficient memory being available or being capable of being installed on the circuit board.

However, the use of SIMMs imposes a practical limitation on the computer system. The physical height of the modules, when mounted on the external circuit board effectively renders closely adjacent expansion slots unusable. Thus, the use of SIMMs have the effect of decreasing the number of expansion slots available in the computer system, thereby decreasing the flexibility of a computer system.

SUMMARY OF THE INVENTION

The present invention is directed toward an ISA memory expansion board utilizing low profile memory expansion modules. An ISA size memory expansion board is equipped with resident memory and buffer and driver circuits for the base memory and a series of expansion modules. The modules are connected to the memory expansion board by means of mating connectors which permit the memory module to be mounted in a plane parallel to the memory expansion board as opposed to perpendicular to the board, as generally dictated by SIMMs. Thus, the modules do not have the effect of disabling the use of other expansion slots when inserted into the memory expansion board. The memory modules and memory expansion board are designed such that a plurality of additional modules may be mounted on an ISA size memory expansion board without significantly increasing the space envelope required by the ISA size memory expansion board. The present invention is capable of adding 16 Mbyte of memory to an ISA computer system, using primarily 1 Mbit memory devices, on a single ISA size board. It will be appreciated that memory devices having a larger memory capacity may be used to increase the total memory size which can be contained on the expansion board.

To allow the use of a sufficient quantity of 1 Mbit memory devices to form a 16 Mbyte memory, the size of the memory modules was minimized. The present invention places the buffer and driver circuitry on the expansion board rather than on the corresponding memory module. In a further effort to minimize the size of the memory modules, the memory devices of the module are mounted on both surfaces of the module.

Identical memory devices are used on both surfaces and arranged so that the address pins are closely adjacent. The $A_0$ address pin of one memory device is connected to the $A_n$ address pin of the memory device on the opposing side to reduce the length of address line conductors. Thus, the length of the memory module is not significantly different than the height of the expansion card and the width of a series of modules is not significantly different from the length of the expansion board.

The present invention is also designed to guard against improper insertion of the memory module in the expansion board. An improper insertion of the module will result in the misalignment of connector and could do significant damage to the memory module and the expansion board. The present invention is designed to prevent this damage from occurring by effectively shorting the power supply when the module is misaligned with the expansion board.

BRIEF DESCRIPTION OF THE DRAWINGS

FIG. 2B is illustrative of a typical SIMM memory module.

FIGS. 4A-4C are different views of the memory module of the present invention.

DETAILED DESCRIPTION OF THE INVENTION

Figure 1:
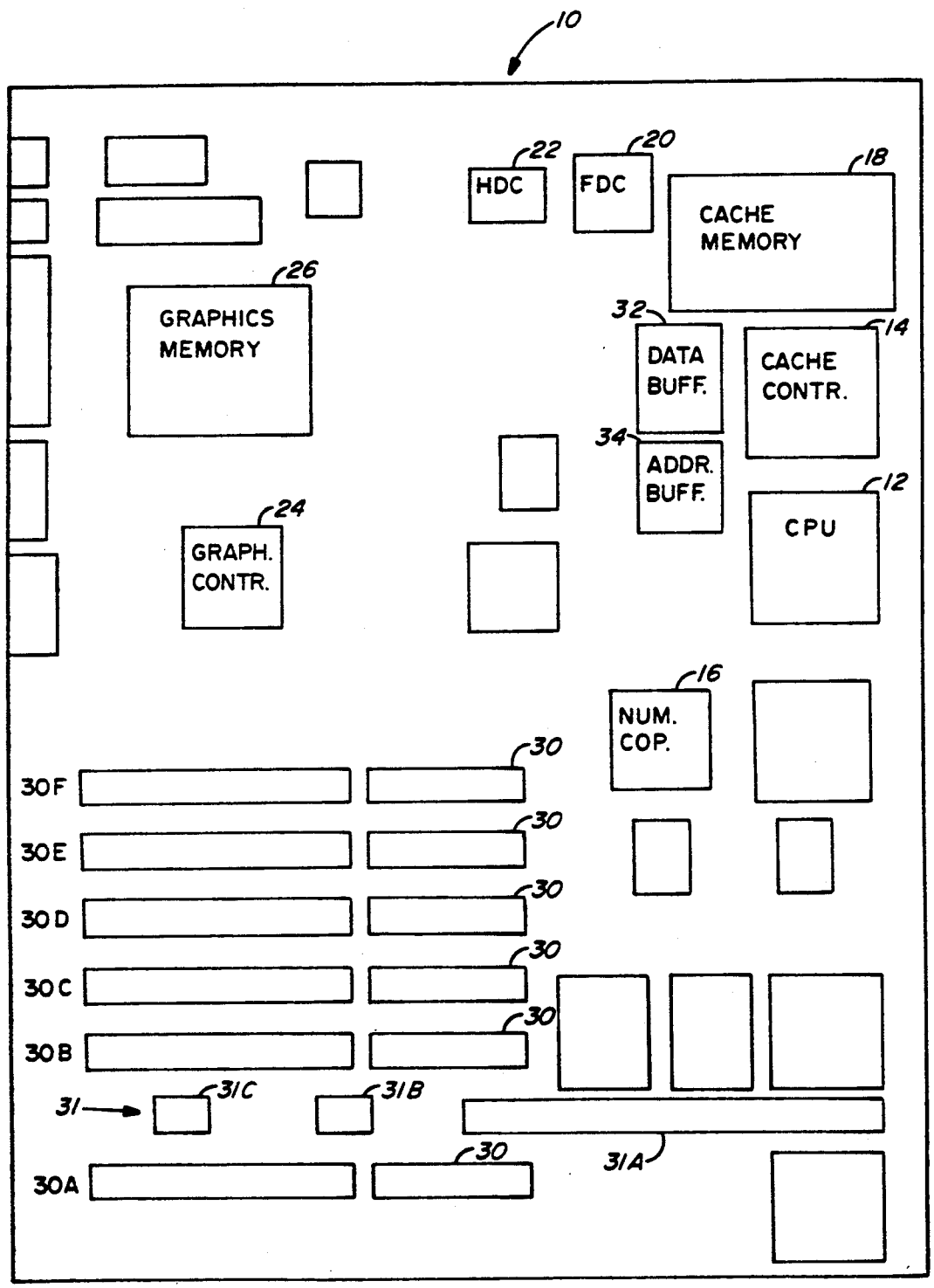
FIG. 1 is block diagram of a computer system motherboard.

FIG. 1, which is a block representation of a microcomputer system board 10, is included only for general physical reference and is used to illustrate the advantages of the present invention. The system board 10 includes a microprocessor CPU 12, a memory cache controller 14 and cache memory 18. A numeric coprocessor 16 may be included as part of the computer system. The system board 10 of FIG. 1 includes an integral video graphics controller 24 and video memory 26. Also included as integral parts on the system board 10 are a floppy disk controller 20 and a hard disk controller 22. It will be appreciated that not all computers systems will have device controllers, such as the hard disk controller 22, or the graphics controller 24 and graphics memory 26 as an integral part of the system. These functions are often mounted an external cards or boards and are inserted into the system board 10 by way of connectors or expansion slots 30. The system board 10 of FIG. 1 is shown as having six expansion slots 30, each of the slots 30 having two discrete connectors for insertion of external cards. Also shown is a special expansion slot 31, having three discrete connectors 31A, 31B and 31C, for use by a memory expansion board. The slots 30 and 31 have uniform spacing between the slots 30 and 31 conforming to the general suggestions and parameters of the ISA. These slots may be used to insert interface and control devices such as disk controllers, graphics controllers, additional memory or other external interfaces such as local interface networks, or modems. It will be appreciated that the availability of these expansion slots 30 significantly increases the flexibility of a computer system.

Figure 2A:
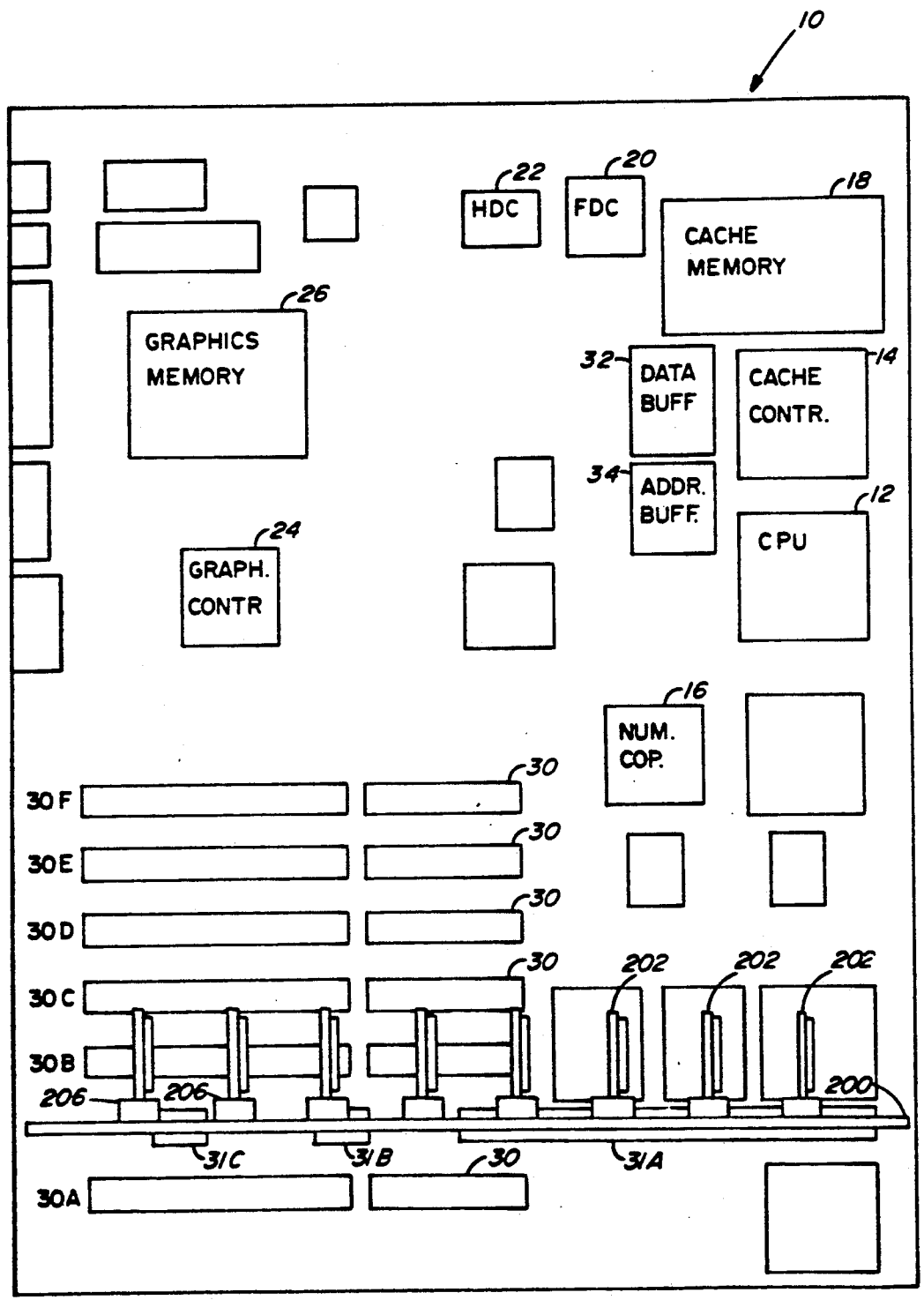
FIGS. 2A and 2B illustrate the problems encountered in using a SIMM technology on an expansion board to increase system memory.
Figure 2B:
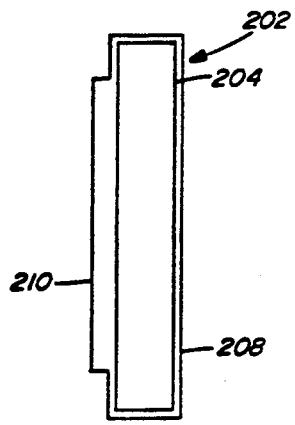

In FIG. 2A, a SIMM memory expansion board 200 has been inserted into expansion slot 31. Mounted on expansion board 200 are a series of connectors 206 and miscellaneous circuitry, including diagnostics, transceivers, and other signal control devices which are not shown. The expansion board 200 lies in a plane which is perpendicular to the system board 10. SIMM memory modules 202 are inserted into the memory expansion board connectors 206 in order to add additional memory to the computer system. In FIG. 2A, a total of eight SIMM modules 202 are installed on the expansion board 200. Referring to FIG. 2B, the SIMM module 202 includes circuit board 208, memory devices 204 and a connector 210 which mates with SIMM expansion board connector 206.

Referring to FIG. 2A, it will be appreciated that the configuration of the expansion board 200 and SIMM modules 202 in memory expansion slot 31 effectively renders expansion slots 30B and 30C unusable. The SIMM modules 202 effectively prevent the insertion of any other card or board into these slots. The net result is that the computer system has been rendered less flexible as a result of the addition of the SIMM memory expansion board 200 and modules 202.

Figure 3:
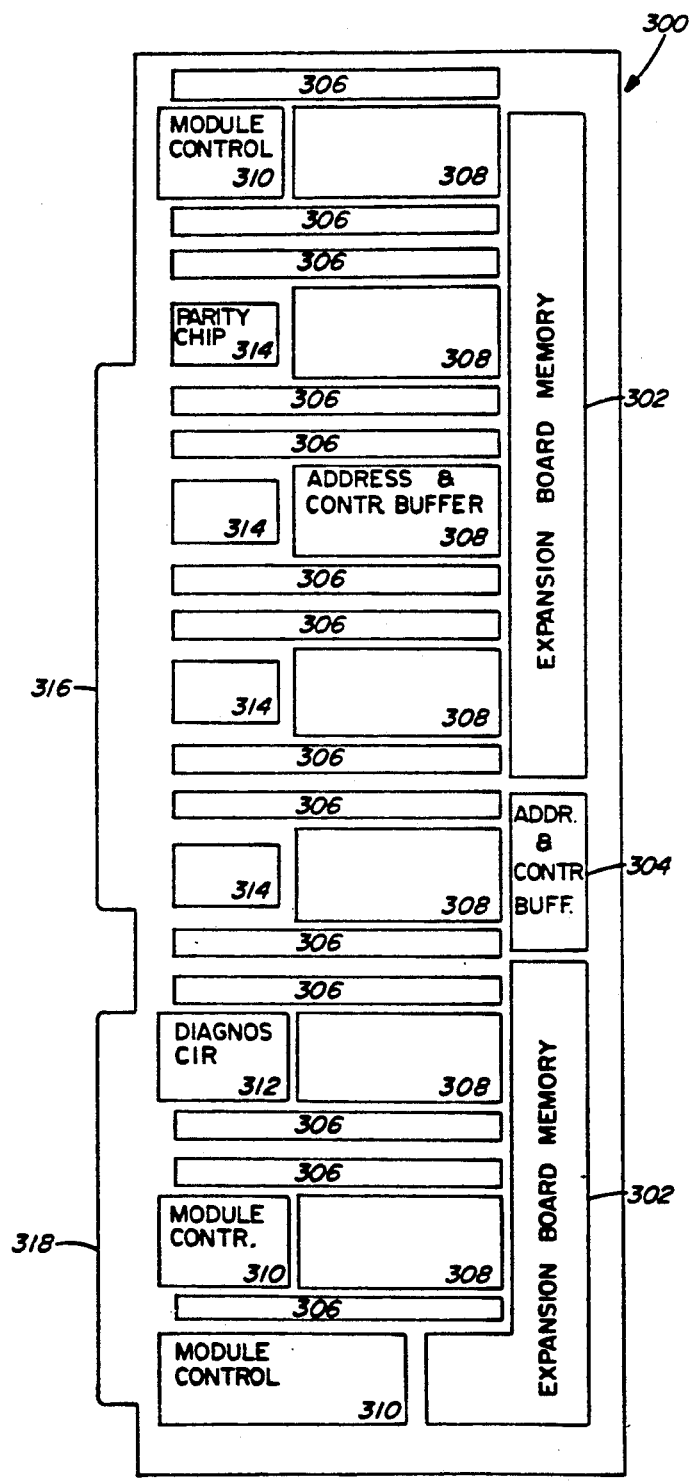
FIG. 3 is a drawing of the memory expansion board of the present invention.

FIG. 3, is a memory expansion board according to the present invention. A memory expansion board 300 is designed to fit into the memory expansion slot 31 as shown in FIG. 1. The expansion board 300 generally conforms to the general size requirements of the ISA, except that the card edges used for connection to the system board are configured differently then as necessary for insertion into an ISA expansion slot, such as a slot 30. An ISA board is approximately 13.375 inches long and 4.8 inches wide, including the card edge. In the preferred embodiment the expansion board 300 is only 13 inches wide to allow for additional clearances. The expansion board 300 includes on-board memory 302 and address and control buffers 304 for the on-board memory. Also mounted on the expansion board are connectors 306 for the insertion of additional memory modules 400 (FIG. 4A). In the illustrated configuration, two connectors 306 are used to connect a memory module 400 to the expansion board 300. In order to minimize the size of the memory modules 400, much of the circuitry associated with each of the modules 400 is placed on the expansion board 300. Address and control signal buffers 308 are mounted between the connectors 306 for each of the modules. The control circuitry for the memory modules 400 is placed on the expansion board 300, thereby decreasing the necessary size of the module 400 itself. In addition, parity chips 314, module control circuitry 310 and diagnostic circuitry 312 commonly used by the on-board memory 302 and the modules 400 are placed on the expansion board 300. Also included as part of the memory expansion board 300 are connectors 316 and 318 which mate with the connectors 31A, 31B and 31C of the system board 10 as shown in FIG. 1.

Thus, the addition of the expansion board 300 by itself increases the effective memory of the computer system. In the preferred embodiment addition of the expansion board 300 would expand memory by 2 Mbytes.

Referring now to FIGS. 4A-4C, FIG. 4A is a bottom view of the memory module 400 of the present invention. The module is comprised of a board 401, having a memory devices area 402, parity devices area 403 and two connectors 404 which are designed to mate with the memory expansion board connectors 306. The module 400 in the preferred embodiment is approximately 4.5 inches tall and 1.625 inches wide. FIG. 4B is a top view of the memory expansion module showing the board 401 and memory device area 402 and parity device area 403. It will be appreciated when viewing FIG. 4C that the expansion module 400 of the present invention is designed to have memory devices 407 mounted on both useable surfaces of board 401. Further, the configuration of the connectors 404 results in a low profile expansion module. In the preferred embodiment of the invention, each module 400 has 2 Mbytes of memory by using 1 Mbit memory devices for data storage and 256 kbit memory devices for parity storage. The data memory devices are preferably organized as 256k by 4 and are located in the memory device area 402, with the 256 kbit parity memory devices being preferably organized as 256k by 1 and being located in the parity device area 403.

Figure 5A:
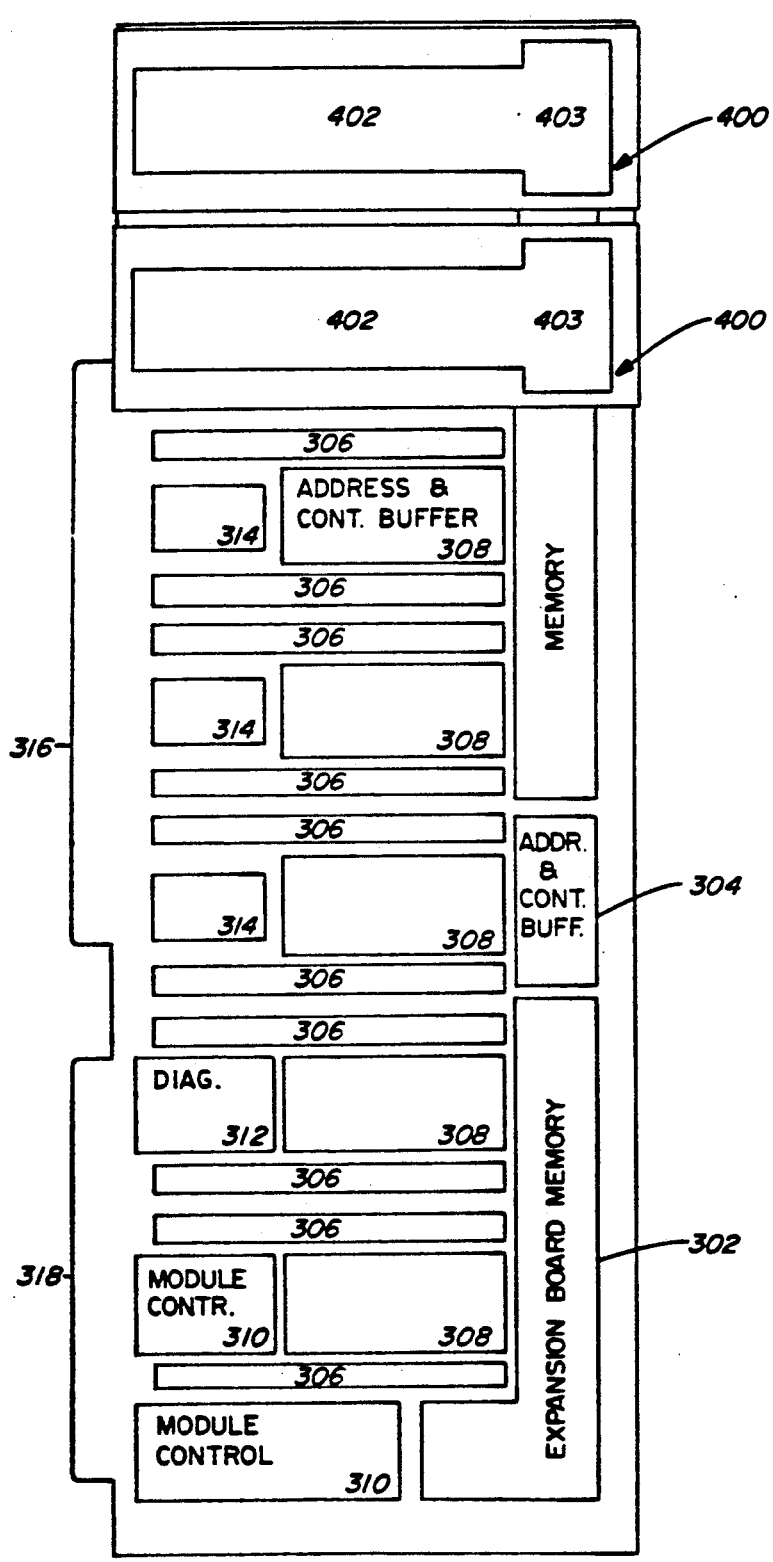
FIGS. 5A and 5B are illustrative of an expansion board populated with two memory modules installed on the expansion board.

Referring now to FIG. 5A, which illustrates the memory expansion board 300 having two memory modules 400 installed, the memory modules 400 do not significantly increase the footprint of the memory expansion board 300. As may be seen in FIG. 5B, when a memory module 400 is installed, connectors 306 and 404 are mated and the module 400 is installed over its accompanying control and address buffers 308. Even though memory devices 407 have been mounted on both sides of the memory module 400, there still exists sufficient clearance between the memory devices 407 and the buffers 308 due to the height of the connectors 306 and 404. The module circuit board 401 is approximately 0.40 inches over the surface of the expansion board 300 when the module 400 is fully seated.

Figure 5B:
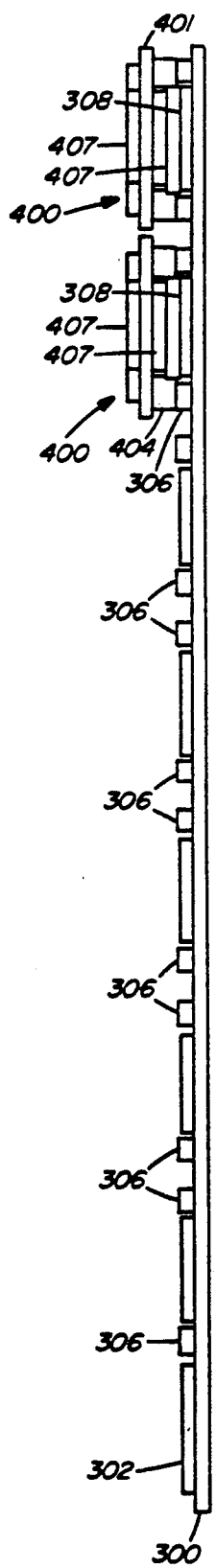
Figure 6:
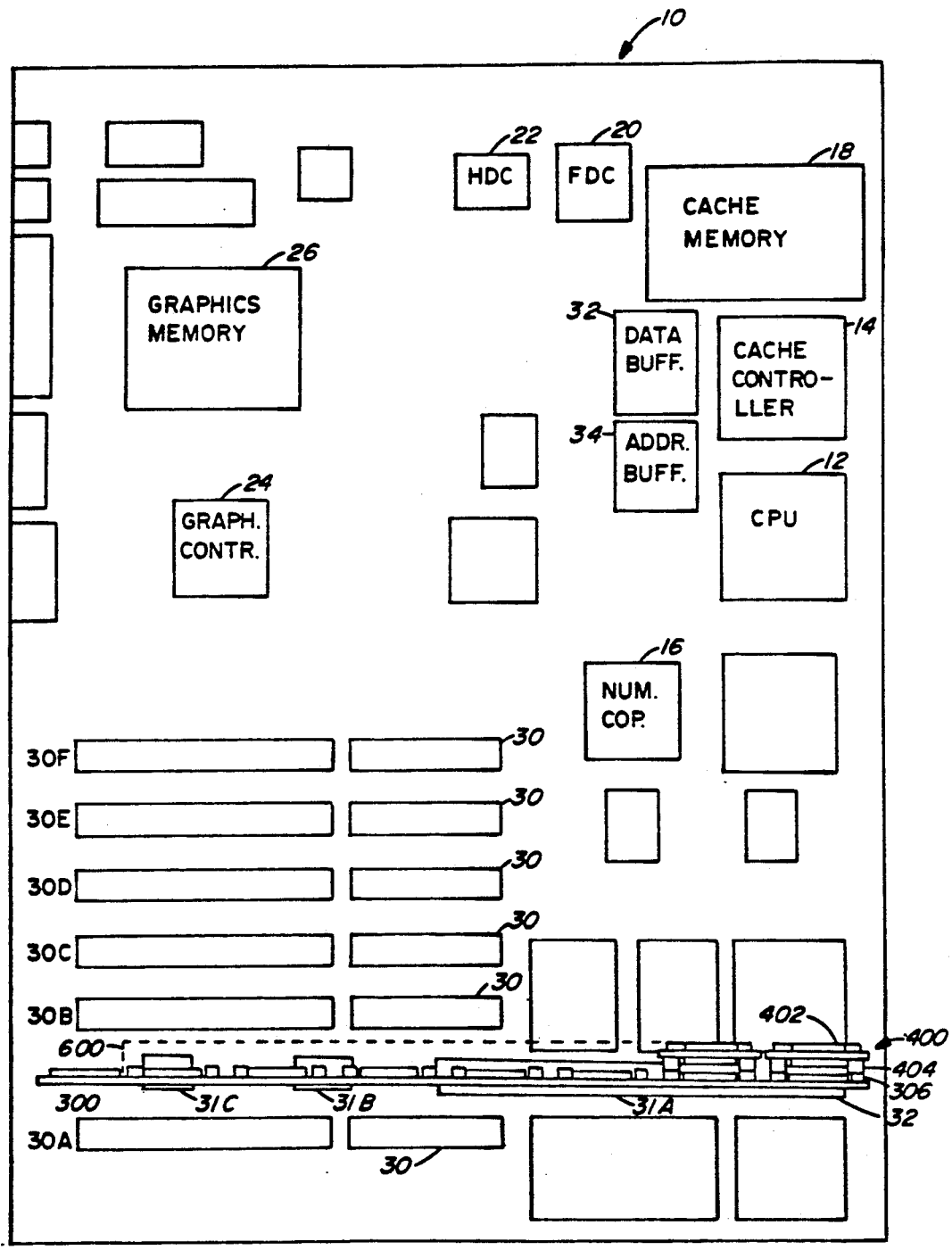
FIG. 6 is illustrative of the advantages of the present invention when installed in a computer system motherboard.

FIG. 6 shows a partially populated expansion board 300 of FIGS. 5A and 5B installed on the system board 10. In the preferred configuration, a special slot 31 using connectors 31A, 31B and 31C has been created for memory expansion board 300. However, it will be appreciated that a memory board having the same configuration could be used in the standard expansion slots 30. It will be appreciated that the low profile of the populated board of FIGS. 5A and 5B does not require the space envelope of comparable SIMM memory expansion boards and modules as shown in FIGS. 2A and 2B. Though only two memory modules 400 are shown as being installed, if the expansion board 300 were fully populated with memory modules 400, the resulting space requirements, as shown by a dotted line 600 would not interfere with the use of expansion slots 30A-30F. Thus, the present invention significantly increases the memory capacity of a computer system in discrete steps without adversely affecting the flexibility of the computer system.

In the current preferred embodiment the system board 10 contains no main memory. The system comes equipped with a memory expansion board 300 which includes 2 Mbyte of memory. As applications require additional memory, the user can purchase memory modules 400 which are configured in 2 Mbyte increments. The user can install up to 7 memory modules on a single board 300, thereby increasing total system available memory to 16 Mbyte. However, it is expected that as the practical storage size of memory devices increases, the memory capacities of the module 400 and the expansion board 300 may be significantly increased with no increase in the size of the expansion board 300 or memory modules 400.

Figure 7:
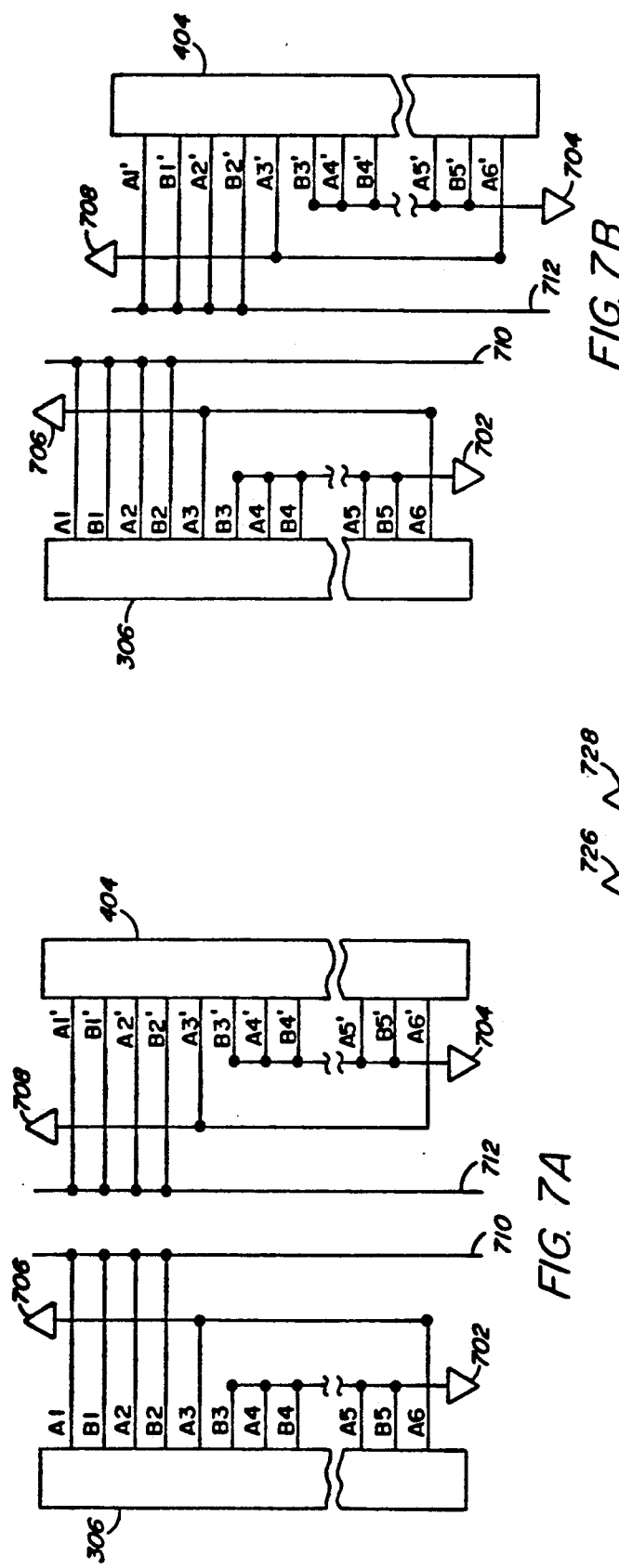
FIGS. 7A-7C are schematics showing the means of protecting semiconductor memory from misalignment.

The present invention also encompasses a method of protecting computer system memory due to misalignment of connectors 306 and 404. FIG. 7A depicts one of the two connectors 306 on expansion board 300, connector 306 having a multiplicity of address, data, control, power and ground lines. In the preferred embodiment, connector 306 is a double row connector, each row having two lines, $A_n$ and $B_n$. Lines A1, B1, A2, and B2 of connector 306 are connected to bus 710. Lines A3 and A6 of connector 306 are connected to power line 706. Lines B3, A4, B4, A5 and B5 of connector 306 are connected to ground 702. FIG. 7A also depicts one of two connectors 404 on module 400. Connector 404 is also a double row connector having a multiplicity of address, data, control, power and ground lines. Lines A1', B1', A2', and B2' of connector 404 are connected to bus 712. Lines A3' and A6' of connector 404 are connected to power line 708. Lines B3', A4', A5' and B5' of connector 404 are connected to ground 702. For the purpose of simplicity and clarity, FIGS. 7A and 7B do not display all of the address, data, control, ground and power lines.

Referring still to FIG. 7A, it will be appreciated that the address, power and ground lines of connector 306 on expansion board 300 will mate with their corresponding address, power and ground lines of connector 404 on memory module 400 and the module 400 will be properly energized. It will be appreciated that connectors 306 and 404 are preferably mating pin and socket connectors.

FIG. 7B illustrates the condition that occurs when the memory module 400 is inserted into the memory expansion board 300 and is misaligned by one connector row. Because connectors 306 and 404 are double row connectors, the module 400 misalignment effectively shifts connector 404 down two line positions. Memory board 300 line A2 is connected to module 400 line A1'. It will be appreciated that the misalignment shown in FIG. 7B could cause severe errors. Further, various signal lines could be misaligned such that two enabled outputs are connected, possibly causing permanent damage to both the memory expansion board 300 and the memory modules 400.

As a further result of the misalignment, connector 306 power line A6 is mated with connector 404 ground line A5' and connector 306 ground line B4 is mated with connector 404 ground line B3', thereby shorting power 706 to ground 702. This power to ground connection creates a short across the power supply of the computer. This short is detected by the computer power supply before any substantial damage can occur to the memory expansion board 300 or modules 400. The power supply itself may be protected by a fuse, circuit breaker or current detection and limiting circuitry. In the preferred embodiment, the computer system includes current limiting circuitry which detects the high current being attempted to be delivered because of the short and turns off the power supply before any permanent damage is done. Further, the current limiting circuitry waits a predetermined period and attempts to reset the power supply. If the misaligned condition persists, the current limiting circuitry again shuts down the power supply and continues to cycle until the misalignment is corrected.

Figure 9:
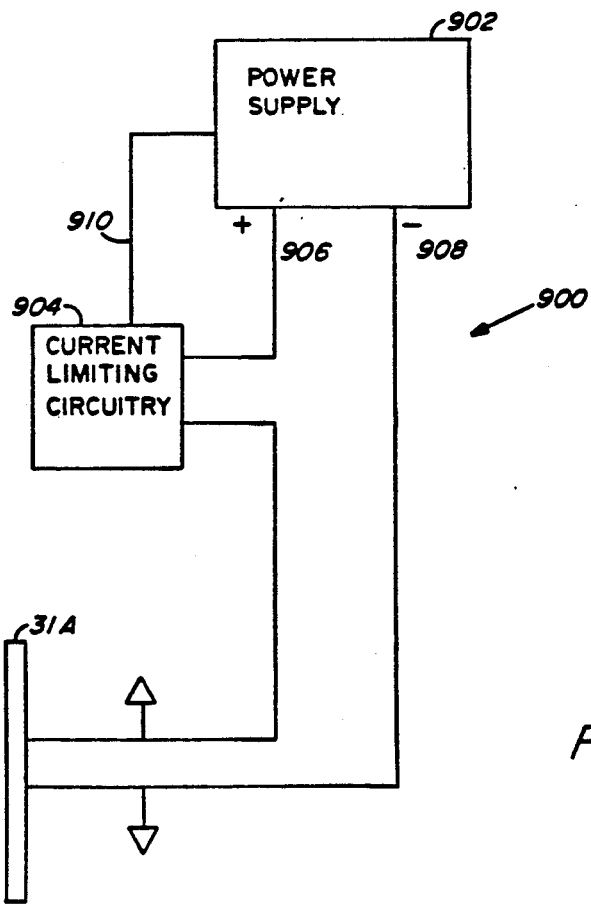
FIG. 9 is a diagram of the current limiting circuit utilized in the present invention.

FIG. 9 is a block diagram showing the preferred method of protecting the power supply. Power supply circuitry 900 includes a power supply 902 having a positive line 906 and a negative line 908. In practice, power supply 902 would provide a number of voltage sources. However, for the purpose of clarity, only the lines which would be used to supply power to the memory expansion board 300 are considered. The positive lead 906 is connected to current limiting and timing circuitry 904 of the type generally known in the industry. The limiting circuitry 904 detects the high current being attempted to be delivered because of the short described in FIG. 7B and turns off the power supply 902 via line 910. Under normal operating conditions, power is supplied through lines 906 and 908 to expansion connector 31A which in turn supplies power to the memory expansion board 300 and memory modules 400.

The protective means, illustrated in FIGS. 7A and 7B is designed to protect the circuitry when the connectors are misaligned in only one direction. FIG. 7C illustrates how the same means may be used to protect circuitry against misalignment in either direction in a general case. Connector 720 is shown as having power 726 connected to line 2 and ground 722 to lines 1, 3, 4 and 5. Lines 1 and 3 may be connected to ground or lines on which it is intended that a low signal be placed. Connector 724 is shown as having power 728 line 2' and ground 730 lines 1' and 3'-5'. When connectors 720 and 724 are misaligned by one position up, a power to ground short is created. Power 726 line 2, is connected to ground 730 line 3' and ground 730 line 5' is connected to ground 722 line 4, creating the short. Similarly, when misaligned one position down a power to ground short is created. Power 726 line 2 is connected to ground 730 line 1' and ground 730 line 4' is connected to line 5, creating the short. It will be appreciated that this general method of creating power to ground shorts may be adapted to various connector configurations.

Referring again to FIGS. 4A-4C, the present invention minimizes the space requirements for the additional memory modules. In doing so, memory devices 407 are mounted on both sides of the memory module 400. The memory device area 402 is shown as a monolithic block but is made up of a plurality of memory devices. The devices are mounted such that all the memory devices are physically aligned in the same direction, i.e., pin 1 on the memory devices pointed in the same direction. However when mounting the memory devices on both sides of the board, the effect is to flip the pin assignments relative to each other. For example, the memory devices are mounted back to back and pin 1 on one memory device is physically located over pin 26 of the opposing memory device.

Figure 8:
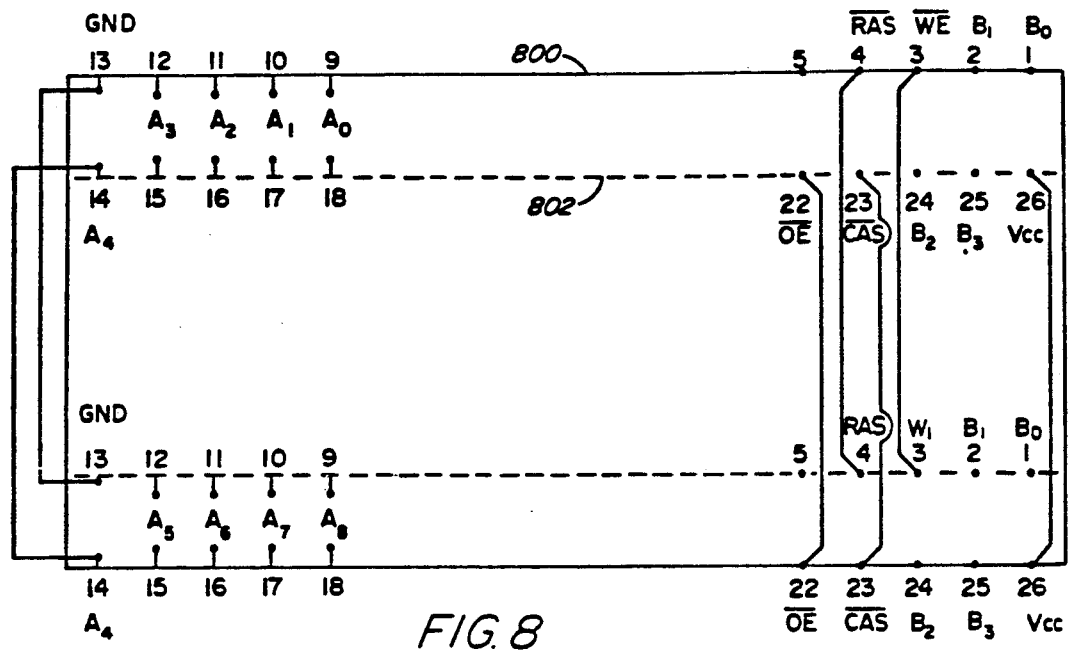
FIG. 8 is illustrative of the means of accomplishing memory addressing in the present invention.

Referring now to FIG. 8, a memory device 800 contained in the memory device are a 402. The device 800 includes data and control signals, B0, B1, WE* and RAS* on pins 1-4; ground on pin 13; control and signals, OE*, CAS*, B2 and B3, data and on pins 22 through 25; and power on pin 26. A second memory device 802 of the same type as memory device 800 is also shown in FIG. 8 as a dashed figure. Device 802 is shown dashed to represent that it appears on the opposite side of the board 401 and is shown smaller to make this illustration easier. It should be understood that there is no physical difference in the size of devices 800 and 802, and indeed that the devices 800 and 802 are identical devices. Device 802 includes data and control signals, B0, B1, WE* and RAS* on pins 1-4; ground on pin 13; data and control signals, OE*, CAS*, B2, and B3 on pins 22 through 25; and power on pin 26. Because it appears as a mirror image to device 800, the physical position of the pins between devices 800 and 802 are misaligned. In FIG. 8, pin 1 appears at the top right of device 800 and at the bottom right of device 802. One manner of addressing this problem is to create a series of runs between the pins to address the mismatch. This is shown in FIG. 8, by way of example as a run between device 800, pin 22 (OE*) to device 802, pin 22 (OE*). The control lines RAS*, CAS*, WE*, OE* and the power line in FIG. 8 are generally shown as having these runs to correct for the misalignment condition. However, there is a disadvantage to this technique when used for address lines. Address lines are preferably as short as possible to limit capacitances and thus allow more memory devices to be driven from a single driver in acceptable times. Further, the shorter lines reduce radio frequency interference, which is always a problem at the speeds of current computer systems.

It was recognized that while certain memory address pins on devices 800 and 802 bore designations of $A_0-A_8$, the designations are arbitrary and an address bit is simply an address bit, not an assigned bit in the vast majority of memory devices. Accordingly, it was determined that the length of any address line runs between the memory devices 800 and 802 could be drastically reduced by flipping the address pin assignments for device 802. Address bits $A_0-A_3$ were assigned to device 800, pins 9-12 and device 802, pins 18-15. Similarly, address bits $A_5-A_8$ were assigned to device 800, pins 15-18 and device 802, pins 12-9. This eliminated the need for most extensive address line runs between the devices 800 and 802. However, one run were required for the memory address lines. Pin 13 (ground) is opposite pin 14, address bit $A_4$. Therefore, two runs were required to properly connect the ground for devices 800 and 802 and address bit $A_4$, which remained assigned to pin 13 on both devices 800 and 802.

It will be appreciated that this means of addressing memory is one which is relatively independent of the arbitrary chip assignment. Further, as a result of this means of addressing memory, the complexity of the memory module 400 design was greatly reduced. The same technique may generally be used where two semiconductor devices having address lines 0-n are mounted on opposite sides of a board. The first device having address $A_0-A_n$ is mounted opposite the second device having address lines $B_0-B_n$. As shown in FIG. 8, control, ground and power lines would be connected via board runs. However, the address lines would be connected as follows:

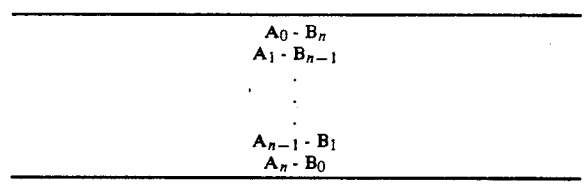

Where this direct connection would result in connecting a power ground or control line to an address line, board runs would be created as shown in FIG. 8 for address line $A_4$.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

We claim:

1. A computer system having means for protecting electronic circuit boards in a computer system during the addition of circuit boards comprising:
- a computer power supply having at least two output terminals;
- a means for limiting current flow in said power supply;
- a first circuit board having means for locating and connecting additional circuit boards, said first circuit board connecting means having a connection for said power supply first output terminal and at least two adjacent connections, both of said adjacent connections being tied said power supply second output terminal;
- a second circuit board having means for locating and connecting said second circuit board to said first circuit board, said second circuit board locating and connecting means having at least one connection to receive said power supply first terminal output, said first power supply output terminal connection corresponding to said power supply first terminal connection on said first circuit board, said second circuit board power connection having at least two connections to connect to said power supply second terminal output, said connections being located on either side of said first power supply output terminal connection, and two adjacent connections to connect to said second output terminal, said adjacent power supply second output terminal connections corresponding to said adjacent power supply second output terminal connections on said first circuit board;
- said connections of said first and second circuit boards being arranged so that the mislocation of said second circuit board in said first circuit board resulting in the connection of system power to system ground, thereby causing the current flow from said power supply to exceed acceptable limits, initiating said limiting means to shut down the supply of power.

2. The computer system of claim 1, wherein said current limiting means comprises an electrical fuse.

3. The computer system of claim 1, wherein said current limiting means comprises an electrical circuit breaker.

4. The computer system of claim 1 wherein said current limiting means includes current limiting circuitry which, upon sensing an excessive current flow, turns off said power supply.

5. The computer system of claim 1, wherein said current sensing circuitry includes means for resetting said power supply.

6. The computer system of claim 1 wherein said locating and connecting means comprise a pin and a mating socket.

* * * * *